United States Patent [19]

Thornburg

[11] 4,181,913
[45] Jan. 1, 1980

[54] RESISTIVE ELECTRODE AMORPHOUS SEMICONDUCTOR NEGATIVE RESISTANCE DEVICE

[75] Inventor: David D. Thornburg, Los Altos, Calif.

[73] Assignee: Xerox Corporation, Stamford, Conn.

[21] Appl. No.: 801,959

[22] Filed: May 31, 1977

[51] Int. Cl.$^2$ ............................................. H01L 45/00
[52] U.S. Cl. ............................................ 357/2; 357/4; 357/51; 357/67; 357/71
[58] Field of Search ................ 357/2, 57; 307/238, 307/252 E, 324, 299 R; 365/163

[56] References Cited

U.S. PATENT DOCUMENTS

| | | | |
|---|---|---|---|
| 3,382,418 | 5/1968 | Jensen | 357/2 |
| 3,432,729 | 3/1969 | Dyre | 357/2 |
| 3,469,154 | 9/1969 | Scholer | 357/2 |
| 3,546,491 | 12/1970 | Berglund | 357/57 |
| 3,629,863 | 12/1971 | Neale | 357/2 |
| 3,864,719 | 2/1975 | Uematsu et al. | 357/57 |
| 3,906,537 | 9/1975 | Thornburg et al. | 357/2 |
| 3,975,755 | 8/1976 | Thornburg | 357/2 |

*Primary Examiner*—William D. arkins
*Attorney, Agent, or Firm*—Irving Keschner; W. Douglas Carothers, Jr.

[57] ABSTRACT

Semiconductor devices which exhibit negative differential resistance and comprise a semiconductor material in contact with an electrode and a resistive film layer, preferably comprising an alloy of nickel and chrome is disclosed. The slope of the negative resistance region and the current filament area can be varied by altering the sheet resistivity of the resistive film layer. This allows the semiconductor device to be incorporated in a single monolithic thin film integrated circuit in which the thickness of the semiconductor layer utilized in the integrated circuit is constant. A method for fabricating the aforementioned semiconductor device is also disclosed.

7 Claims, 7 Drawing Figures

CURRENT CONTROLLED
NEGATIVE DIFFERENTIAL
RESISTANCE

RESISTIVE ELECTRODE AMORPHOUS SEMICONDUCTOR NEGATIVE RESISTANCE DEVICE

BACKGROUND OF THE INVENTION

Semiconducting devices have been developed which are made from solid substances that are glassy rather than crystalline which nevertheless may be employed to control the flow of electric current. An example of such a device is the Ovonic switch developed by Stanford R. Ovshinsky. His switch is a threshold device comprising a two-terminal component which may have two states in an electrical circuit, namely, an almost non-conducting state and a conducting state. The device is usually in the nearly non-conducting state, i.e., off; but when the voltage across the device reaches a certain threshold value, it goes to the conducting state, i.e., switches on. On the removal of the applied voltage, the off state is immediately restored.

Among the many types of non-crystalline materials which are being investigated for such devices are amorphous oxides (including oxides of the vanadium, tungsten, phosphorous, germanium and silicon) and chalcogenide glasses, which may be regarded as inorganic polymers. The term chalcogenic is applied to any of the elements in Group VIa of the periodic table: oxygen, sulphur, selenium, and tellurium. The chalcogenide glasses include binary systems (for example, germanium-tellurium), ternary systems (various three-component mixtures of germanium, arsenic, tellurium, silicon, selenium zinc, and cadmium) and quarternary systems composed of the same elements.

Semiconducting glasses of specific compositions have been shown by Shanefield in U.S. Pat. No. 3,448,425 to exhibit current controlled negative differential resistance.

U.S. Pat. No. 3,906,537 discloses an amorphous semiconducting device of a given chemical composition exhibiting either current controlled negative differential resistance (CNDR) or threshold switching behavior (TS) depending upon the geometrical relationship of the semiconductor material utilized with the electrodes in contact therewith. In those semiconductor devices which exhibit the CNDR characteristic, the slope of the negative resistance region of the V-I characteristic is generally constant and dependent primarily on the thickness and chemical composition of the semiconductor material utilized.

In both CNDR and TS type devices, current filamentation normally will occur. This filamentation is a characteristic of the devices in which one region of the semiconductor layer may carry an increased current density over that carried in neighboring areas, the increase in current density resulting in a reduction in device voltage, and hence reduced current density in other areas of the device. At steady-state, most of the device current is being carried by a small high-current density filament which need not be structurally different from the surrounding material.

Although desirable from the standpoint of providing useful applications for semiconductor devices, current filamentation as known in the prior art CNDR devices produces problems since the location of the filament is not readily controlled. Therefore, in prior art CNDR devices filamentation is generally suppressed through geometrical and thermal constraints.

It would be desirable, therefore, if a CNDR device could be fabricated wherein the slope of the negative resistance region can be altered without changing the thickness of the semiconductor material being utilized, this device characteristic allowing semiconductor devices with different V-I characteristics to be incorporated in a single monolithic thin film integrated circuit in which the semiconductor layer thickness is constant and wherein the location and size of the current filamentation can be such that it can thermally interact with adjacent devices formed as an array in a controlled and desired manner to provide useful applications since the threshold voltage of semiconductor devices are temperature dependent.

SUMMARY OF THE PRESENT INVENTION

The present invention provides a semiconductor negative resistance device in which the negative resistance region of the V-I characteristic can be varied without changing the thickness of the semiconductor material utilized and wherein a controlled current filamentation is produced when the device is raised above threshold, the filamentary region being located at or near the periphery of the device. The semiconductor device comprises a substrate having a resistive electrode layer formed thereon, a conducting film overlying a portion of the resistive electrode layer, a semiconductor material, one surface of which is in direct contact with said resistive electrode layer and an additional conductive film overlying the other surface of the semiconductor material. Conductive wires are bonded to the conductive films to allow an appropriate bias voltage to be applied to the device. By appropriate selection of the resistivity of the resistive electrode layer, the slope of the negative resistance region of the V-I characteristic can be controlled while at the same time controlling the size and location of the current filament. A method for fabricating the semiconductor devices of the present invention is also set forth.

It is an object of the present invention to provide an amorphous semiconductor device which incorporates a resistive electrode whereby the slope of the negative resistance region of the device V-I characteristic can be changed by varying the resistivity of the resistive electrode.

It is a further object of the present invention to provide an amorphous semiconductor device which incorporates a resistive electrode whereby the slope of the negative resistance region of the device V-I characteristic and the current filament area associated therewith are both controlled by varying the resistivity of the resistive electrode.

It is still another object of the present invention to provide a CNDR semiconductor device wherein the slope of the negative resistance region of the device V-I characteristic can be varied without changing the thickness of the semiconductor layer utilized in the device.

It is an object of the present invention to provide a semiconductor device for which the negative region of the device V-I characteristic can be altered in a controlled manner by varying the device manufacturing process and wherein controlled current filamentation is produced when the device is biased above threshold.

It is still another object of the present invention to provide a method for fabricating a semiconductor device of the type described hereinabove.

BRIEF DESCRIPTION OF THE DRAWINGS

For a better understanding of the invention as well as other objects and further features thereof, reference is made to the following description which is to be read in conjunction with the following figures wherein.

DESCRIPTION OF THE PREFERRED EMBODIMENT

Figure 1:
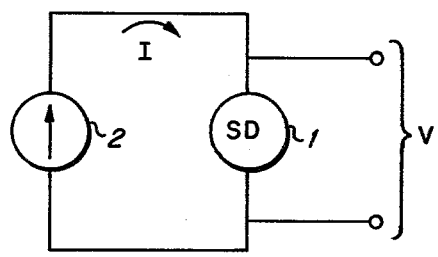
FIG. 1 is a schematic circuit for biasing a device of the present invention.

In FIG. 1 is shown a typical schematic circuit for biasing a two-terminal semiconductor device 1. The semiconductor device 1 is biased by a variable current source 2. The voltage V across the device 1 will vary with the current 1 depending upon the geometry as well as the chemical composition of the device 1.

Figure 2:
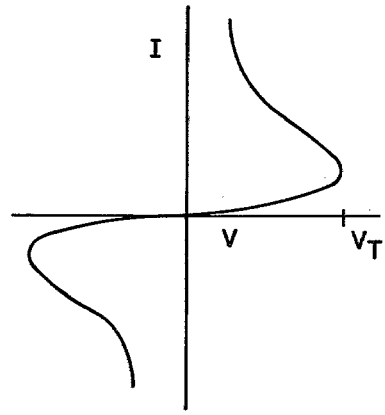
FIG. 2 is a graphical representation of current controlled negative differential resistance behavior exhibited by an amorphous semiconductor device.

For a device 1 exhibiting negative resistance effects, the typical V-I characteristic would be that shown in FIG. 2. For a current controlled negative differential resistance (CNDR) behavior, it is seen that all regions of the V-I curve are accessible. For positive currents, these regions are of three types; a generally high resistance region from the origin to the turnover voltage $V_T$; a region of negative differential resistance; and a region of low resistance. This curve is typically symmetric upon a reversal of the applied current.

Figure 3B:
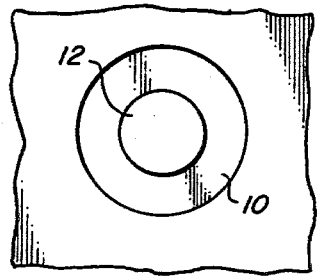
FIGS. 3(a) and 3(b) are a cross-sectional view and a plane view, respectively, of the novel resistive electrode amorphous semiconductor device of the present invention.
Figure 3A:
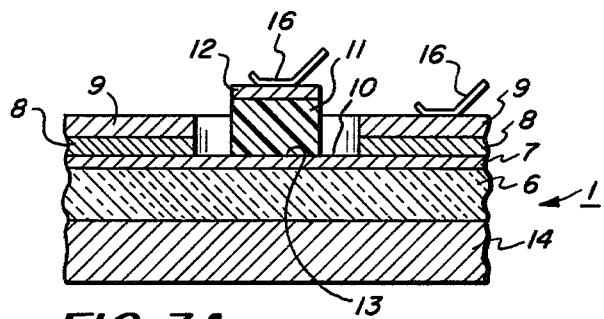

The device configuration of the present invention which yields CNDR behavior is shown in cross-section in FIG. 3(a). The device 1 is comprised of various layers deposited upon a substrate 6 which may comprise a smooth sheet of glass. A layer of resistive film 7, which may comprise an alloy of nickel and chromium is deposited upon substrate 6. The thickness of layer 7 is variable and is determined by its sheet resistivity required both to provide a desired slope of the negative resistance region of the V-I characteristic of the CNDR device and to control the area of the current filament. A conductive thin film (thickness on the order of 0.25 $\mu$m) of aluminum 8 is deposited on the resistive film 7 and a conductive thin film (on the order of 0.25 $\mu$m thickness) of chromium 9 is deposited on layer 8. It should be noted that the chromium layer is used for fabrication convenience but a single conductive layer may be utilized. By utilization of photolithographic and chemical etching techniques described in more detail hereinbelow, an annular or circular portion 10 of the conductive film layers 8 and 9 is removed to expose the underlying resistive film 7. A thin film 11 of semiconducting material of any reasonable thickness, typically 2 $\mu$m, is then deposited on film 9.

The semiconducting material 11 can be selected from the class of amorphous materials known as chalcogenide glasses, examples of which are alloys consisting of, by atomic fraction, 40% arsenic, 60% tellurium; 40% arsenic, 40% selenium, 20% tellurium; 40% arsenic, 20% selenium, 40% tellurium; and 48% tellurium, 30% arsenic, 12% silicon, 10% germanium. Other alloys could be chosen for their electrical properties and resistance to crystallization. In the preferred embodiment, semiconducting material 11 comprises cadmium arsenide ($CdAs_2$). A description of this amorphous semiconductor material and its properties are set forth in U.S. Pat. No. 3,975,755. On the exposed surface of the layer 11 is deposited an additional conductive film 12, a suitable material for the film 12 being an aluminum layer 0.25 $\mu$m thick. The conductive films 12 and 8 and 9 would serve as the electrode media for the device 1.

FIG. 3(a) shows the CNDR device 1 which results from modifying the conducting film 12 to define a conductive pad of some defined geometry, e.g., a square or circle, by photolithographic and chemical etching techniques described in more detail hereinbelow. The semiconductor layer 11 is fabricated to have the same domain and geometry as the conductive film 12. Specifically, the second etching process is accomplished by the use of a selective chemical etch, using the conductive pad as a mask. The bottom area of semiconductor material 11 is in contact with portion 13 of resistive layer 7 as shown in the figure. The substrate 6 may then be bonded to a fixture 14 with an adhesive, usually chosen for good thermal transport properties. Conductive wires 16 are bonded to the conductive films 9 and 12 to effectively use such films as electrodes. For purposes of simplification, electrode 16 is not shown in FIG. 3(b).

In the preferred embodiment, the resistive layer, or film 7 comprises an alloy of nickel and chromium preferably having the following percentages: Ni 80%; Cr 20%. Typical materials which also may be utilized include Ni (nickel) and $CrSi_2$ (chromium silicide), the resultant device behavior being governed primarily by the sheet resistivity of the resistive layer 7 and not by the composition of the material utilized for the resistive layer.

Figure 4A:
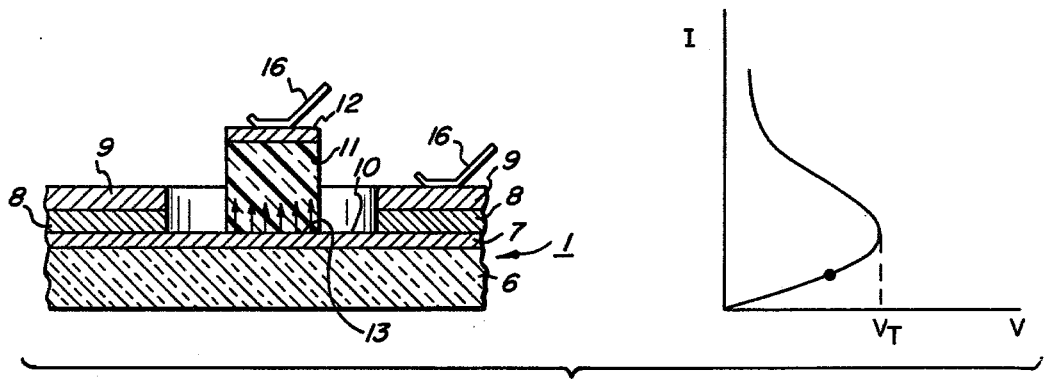
FIGS. 4(a)–4(c) illustrate the current flow through the semiconductor layer as a function of threshold bias and the associated V-I characteristic.
Figure 4B:
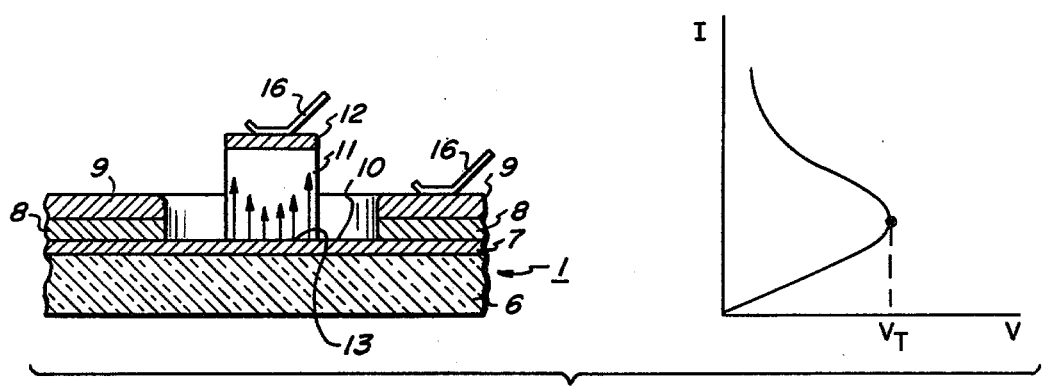
Figure 4C:
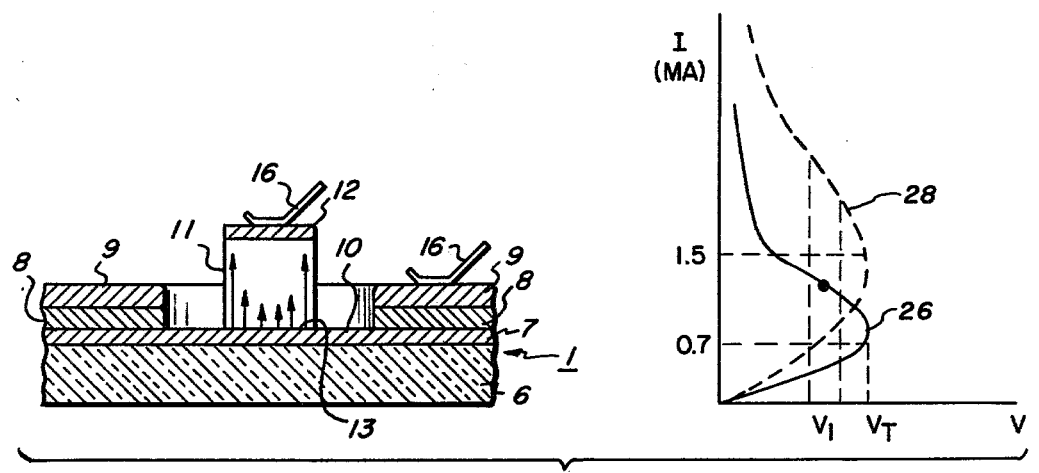

For purposes of illustrating the advantages of the semiconducting device of the present invention, reference is made to FIGS. 4(a)–4(c) which shows the device at various threshold levels with its associated V-I characteristic (conductive leads 16 are assumed to be coupled to an appropriate current bias source, such as source 2 shown in FIG. 1). It should be noted that in the CNDR device of the type shown in U.S. Pat. No. 3,906,537, current flow is uniform over the area of the semiconductor film because both electrodes are at the same potential difference everywhere, including the semiconductor film and the portions of the film in contact therewith. With the device 1 of the present invention biased as shown in FIG. 4(a) with bottom conductive films 8 and 9 held at ground potential and at low bias levels (typically 0.4 ma and 12 volts) below turnover, the semiconductor 11 will have a high resistivity so that the bottom resistive electrode layer 7 will appear essentially as a conductor. The current flow through the semiconductor 11 will thus be nearly uniform as depicted by the arrows in FIG. 4(a). As the bias is increased, the semiconductor layer 11 will be heated by the production of Joule heat, and its accompanying resistive electrode 7 layer will now appear more resistive when compared to the amorphous semiconductor 11 than in the situation described in FIG. 4(a). Semiconductor 11 will begin to support local voltage gradients with the attendent current flow as shown in FIG. 4(b). Because of the geometry of device 1, the voltage drop across the semiconductor layer 11 will be greater at the periphery of the semiconductor layer 11 than at its center, and the current density will thus be higher near this boundary. Once the threshold point (typically 0.7 ma and 14 volts) is passed (FIG. 4(c)) this annular current filament will carry proportionately more current than the central area of the semiconductor 11 because of the positive feedback of the negative differential resistance effect. This will cause the resulting negative resistance portion 26 of the device V-I characteristic of the present invention to break back with a lower slope than the slope 28 (shown in dotted lines in FIG. 4(c)) which is typical for prior art CNDR devices for which the bottom electrode is a conductor as is the case for the CNDR device described in the aforementioned patent. The current increase due to the decreasing resistance of semiconductor layer 11 is the operating mode for devices having the V-I characteristic of FIG. 2. This effect is combined with a decrease in the effective current carrying area of the device of the present invention and the decrease in the effective current carrying area arises from an increased voltage drop across the resistive electrode layer 7.

The slope of the negative resistance region 26 and the area of the current filament can be changed by altering the sheet resistivity of resistive layer 7 during the fabrication procedure. Further, this device characteristic allows devices with different V-I characteristics to be readily incorporated in a single monolithic thin film integrated circuit in which the semiconductor layer thickness must be constant.

Devices were fabricated on several 50×50 mm$^2$ Corning 0211 glass substrates (0.02 cm thick) by the following procedure:

(a) the glass substrates were cleaned, loaded into a vacuum evaporator and heated to a temperature of approximately 100° C.;

(b) a nickel-chromium alloy film was vacuum deposited onto the heated substrates to a sheet resistivity of 70 ohms/□, the film comprising the resistive electrode material;

(c) an aluminum film was vacuum deposited onto the nickel-chromium film to a thickness of 0.25 μm;

(d) a thin film of chromium was deposited on the aluminum film to a thickness of 0.25 μm, aluminum and chromium layers in this fabrication procedure comprising a bottom conductor layer;

(e) the vacuum deposited substrates were removed from the vacuum system and coated with standard photoresist material such as GAF #PR115;

(f) the photoresist coated substrates were then exposed to ultraviolet (UV) light through a mask consisting of an array of circular openings ranging from $8 \times 10^{-3}$ to $2.3 \times 10^{-2}$ inches in diameter;

(g) after development of the photoresist the substrates were successively immersed in chromium and aluminum etchants to expose circular areas of the underlying nickel-chromium film;

(h) the residual photoresist was stripped and the substrates were loaded into a vacuum system and vacuum coated with a thin semiconductor film of amorphous CdAs$_2$ (cadmium arsenide) to a thickness of 2 μm;

(i) this semiconductor film was then vacuum coated with a thin film of aluminum (0.25 μm);

(j) the substrates were then coated with photoresist and exposed to UV through a mask which define circular pads $7 \times 10^{-3}$ inches in diameter; and (k) after development of the photoresist, the wafers were immersed in an etchant which removed Al and the semiconductor film from the substrate surface except for the circular pad areas.

The fabricated devices constituted an array composed of a plurality of devices having geometries similar to that shown in FIGS. 3(a) and (b). Completed device arrays were scribed into 0.1 inch squares and mounted on TO-101 header fixtures 14 with a thermally conductive epoxy. Wires formed of an alloy of aluminum and silicon were ultrasonically bonded to the header leads and the individual devices. The array devices showed stable CNDR behavior with turnover occuring at about 0.7 ma and 14 volts. The bottom chromium/aluminum layer served as the common electrode for all devices in the array.

CNDR type devices using layer 9 as the bottom electrode and utilizing the same semiconductor material of approximately the same thickness as that in the resistive electrode device, were fabricated during the same cycles to ascertain the effect of the resistive layer 7. This is illustrated by the V-I characteristic shown in FIG. 4(c) (it should be noted that the characteristic has not been drawn to scale but shows the difference in negative resistance regions between the resistive electrode device of the present invention (solid line characteristic 26) and the CNDR device of the prior art (dotted line characteristic 28)). The turnover voltage $V_T$ is the same for both devices but the V-I characteristic 26 shows a much sharper negative resistance region which has been measured to occur at about one-half (0.7 ma) the current required for the CNDR device (approximately 1.5 ma). For a nickel-chromium layer 7 having a resistivity of about 70 ohm/□, corresponding to a layer thickness of about 300 A, a negative slope of approximately −4000 ohms was measured in the voltage region V whereas a negative slope of −2000 ohms was measured for the CNDR devices fabricated during the same cycle in the same voltage region.

It has been ascertained that the slope of the negative resistance region of the V-I characterisitc can be altered in a controlled manner by varying the sheet resistivity of the bottom resistive layer 7, the slope decreasing (greater negative resistance) as the resistivity increases. The variation in resistivity can be accomplished by depositing different thickness layers of the material utilized for the resistive layer 7 during vacuum deposition or by changing the chemical composition of the resistive layer material until the desired resistivity is attained which can be determined by an appropriate device calibrated in ohms/□. The range for sheet resistivity which can be utilized in the present invention is from approximately 10 to $10^6$ ohms/□, the preferred range being from about 50 to about 500 ohms/□. The location of the current filament in all cases is at or near the periphery of the semiconductor 11.

Although the V-I characteristic of a semiconductor device of the type described hereinabove, including the negative resistance region thereof, can be varied by changing the thickness of the semiconductor material, the fact that the slope of the negative resistance region can be altered by varying the resistivity of the bottom resistive layer allows a circuit designer to use such a device in a single monolithic thin film integrated circuit in which the thickness of the semiconductor layer is required to be constant.

While the invention has been described with reference to its preferred embodiment, it will be understood by those skilled in the art that various changes may be made and equivalents may be substituted for elements thereof without departing from the true spirit and scope of the invention. In addition, many modifications may be made to adapt a particular situation or material to the teaching of the invention without departing from its essential teachings.

What is claimed is:

1. A semiconductive negative resistive device comprising a first solid state element of semiconductive glass material capable of exhibiting a voltage-current characteristic having negative differential resistance behavior with a generally high resistance region below a threshold voltage and a low resistance region beyond said threshold voltage wherein a current filament behavior may be observed, first electrode means disposed on a major surface of said first element, a second solid state element of resistive material disposed on the major surface of said first element opposite to said first mentioned major surface, said second element having a sheet resistivity in the range from about 10 to about $10^6$ ohms per square to provide desired slope behavior of said low resistance region and control the extent of the area of the current filament established in said first element when the device is operating in said low resistance region, and second electrode means secured to said second element.

2. The device of claim 1, wherein said first element semiconductive glass material is a chalcogenide glass.

3. The device of claim 1, wherein said first element semiconductive glass material is cadmium arsenide.

4. The device of claim 1, wherein the preferred resistivity range of said second element resistive material is from about 50 to about 500 ohms per square.

5. The device of claim 1 wherein said second element resistive material comprises a nickel-chromium alloy.

6. The device of claim 1 wherein said second element resistive material comprises chromium silicide.

7. The device of claim 1, wherein in said second solid state element is of two dimensional extent sufficient to contain a plurality of said first solid state elements to provide a single monolithic thin film integrated circuit, first electrode means for each of said first solid state elements, said second electrode means and said second solid state element being common for all of said first solid state elements.

* * * * *